United States Patent [19]
Cox et al.

[11] Patent Number: 5,946,328
[45] Date of Patent: Aug. 31, 1999

[54] METHOD AND MEANS FOR EFFICIENT ERROR DETECTION AND CORRECTION IN LONG BYTE STRINGS USING INTEGRATED INTERLEAVED REED-SOLOMON CODEWORDS

[75] Inventors: Charles Edwin Cox, San Jose; Martin Hassner; Ralf Kötter, both of Palo Alto; Arvind Patel, San Jose, all of Calif.

[73] Assignee: International Business Machines Corporation, Armonk, N.Y.

[21] Appl. No.: 08/971,796

[22] Filed: Nov. 17, 1997

[51] Int. Cl.[6] .................................................. H03M 13/00
[52] U.S. Cl. ..................................... 371/37.11; 371/37.12; 371/37.5; 371/37.7; 371/38.1; 371/40.14; 371/41
[58] Field of Search ............................ 371/37.11, 37.12, 371/37.4, 37.5, 37.6, 37.7, 37.8, 38.1, 39.1, 41, 40.11, 40.14, 40.16, 40.17, 40.18, 40.2, 40.3, 40.4

[56] References Cited

U.S. PATENT DOCUMENTS

| | | | |
|---|---|---|---|
| 4,525,838 | 7/1985 | Patel | 371/37.4 |
| 4,562,577 | 12/1985 | Glover et al. | 371/40.14 |
| 4,633,471 | 12/1986 | Perera et al. | 371/37.1 |
| 4,706,250 | 11/1987 | Patel | 371/38.1 |
| 4,833,679 | 5/1989 | Anderson | 371/37.7 |
| 4,849,975 | 7/1989 | Patel | 371/38.1 |
| 4,951,284 | 8/1990 | Abdel-Gahaffar et al. | 371/38.1 |
| 5,384,786 | 1/1995 | Dudley et al. | 371/37.11 |
| 5,428,628 | 6/1995 | Hassner et al. | 371/37.8 |
| 5,444,719 | 8/1995 | Cox et al. | 371/40.14 |
| 5,696,774 | 12/1997 | Inoue et al. | 371/37.4 |

OTHER PUBLICATIONS

Blokh et al., "Coding of Generalized Concatenated Codes", *Problems of Information Transmissoin*, vol. 10, No. 3, pp. 45–50.
E. R. Berlekamp, "Algebraic Coding Theory", McGraw–Hill Book Co., 1968, pp. 176–199.
G. Clark et al., Error Correction Coding for Digital Communications, Plenum Press, Inc., 1981, pp. 189–215.
T. Horiguchi, "High–speed Decoding of BCH Codes Using a New Error–evaluation Algorithm", *Electronics & Communications in Japan Part 3*, vol. 72, No. 12, 1989, pp. 63–71.

*Primary Examiner*—Emmanuel L. Moise
*Attorney, Agent, or Firm*—R. Bruce Brodie

[57] ABSTRACT

A method and means for enhancing the error detection and correction capability obtained when a plurality of data byte strings are encoded in a two-level, block-formatted linear code using codeword and block-level redundancy by logically summing the data byte strings and mapping the logical sum and the data byte strings into counterpart codewords including codeword check bytes in accordance with the same linear error correction code. Next, the codewords are logically summed. The codewords and their logical sum are interleaved in a predetermined pattern prior to being recorded on a storage device or the like. On read back, the codewords of a block and their logical sum are syndrome processed to resolve any identified errors within the correction capability of any single word and any errors within the correction capability of any single word and block-level redundancy, and to provide signal indication when the correction capacity has been exceeded.

13 Claims, 6 Drawing Sheets

INTEGRATED INTERLEAVED ENCODER

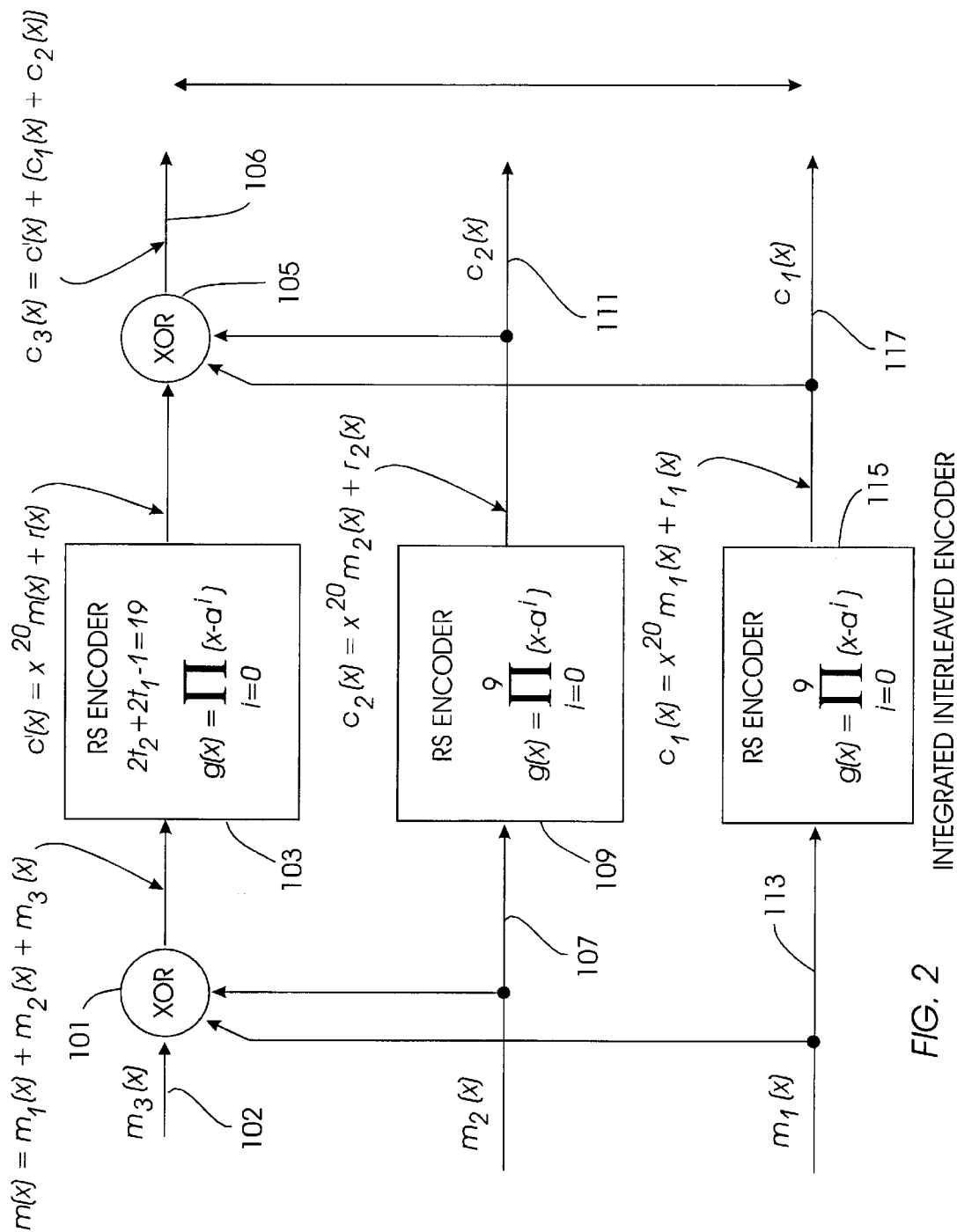
FIG. 2 INTEGRATED INTERLEAVED ENCODER

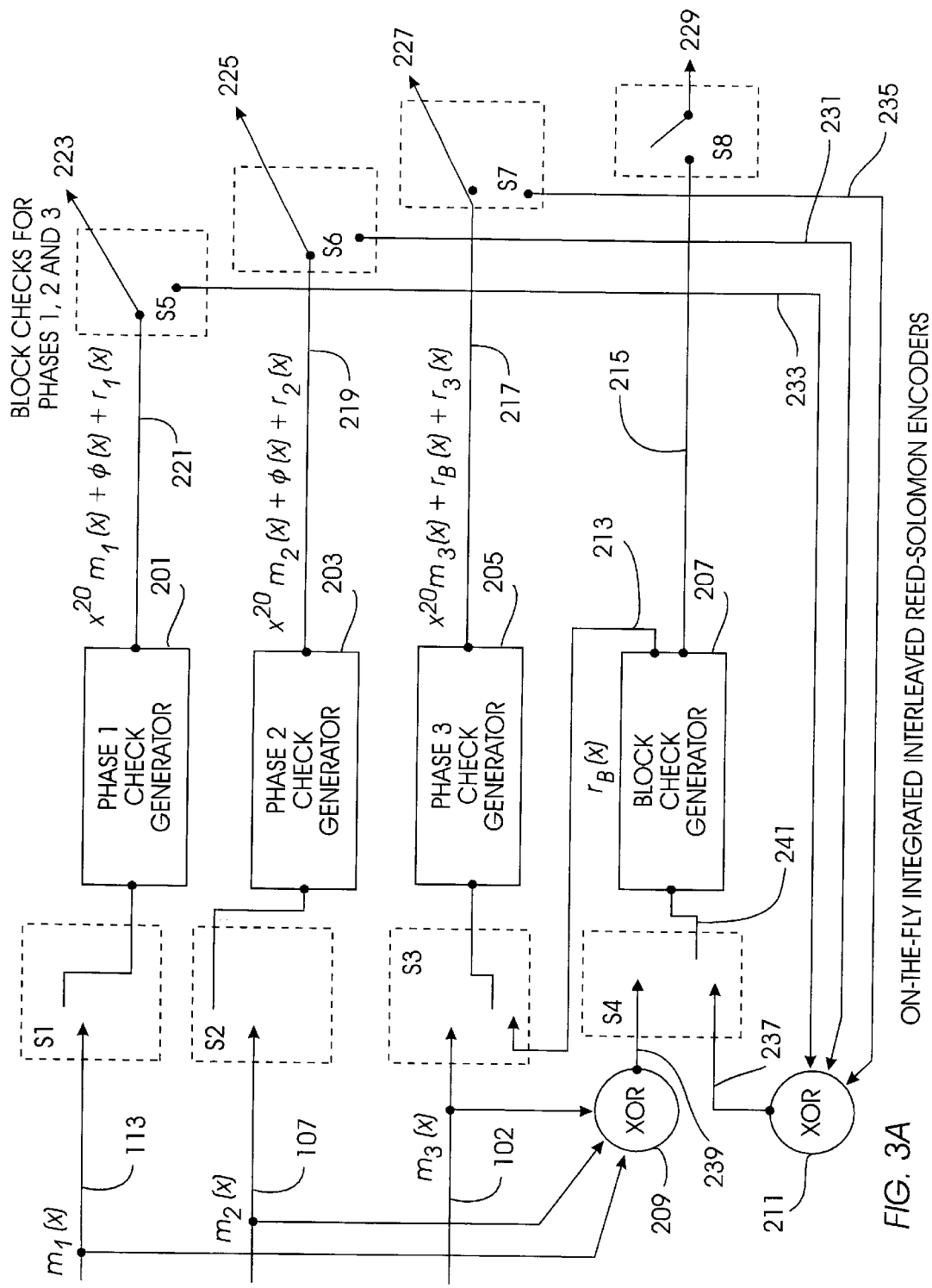
FIG. 3A  ON-THE-FLY INTEGRATED INTERLEAVED REED-SOLOMON ENCODERS $m_{1,1}$ | $m_{2,1}$ | $m_{3,1}$ | - - - | $r_{b_1}$ | $r_{b_2}$ | - - - | $r_{1,1}$ | $r_{2,1}$ | $r_{3,1}$ | - - -

FIG. 3B

INTERLEAVED RS ENCODER OUTPUT FORMATS IN THE EMBODIMENT SHOWN IN FIG. 3A

METHOD AND MEANS FOR EFFICIENT ERROR DETECTION AND CORRECTION IN LONG BYTE STRINGS USING INTEGRATED INTERLEAVED REED-SOLOMON CODEWORDS

FIELD OF THE INVENTION

This invention relates to methods and means for the detection and correction of multibyte errors in long byte strings formatted into a two-level block code structure. Each of the blocks comprises a plurality of codewords and their check bytes from a linear error correction code and additional block check bytes derived from some attribute taken over all of the codewords. The block-level check bytes can be used to detect and correct errors in codewords when such errors exceed the check byte correction capacity of any single codeword.

DESCRIPTION OF RELATED ART

In the following paragraph, some aspects of linear cyclic codes are described. This provides a foundation for discussing aspects of the Reed-Solomon code, the prior art, and the invention. Next, the discussion then focuses on the prior art as exemplified by Patel et al., U.S. Pat. No. 4,525,838, "Multibyte Error Correcting System Involving a Two-level Code Structure", issued Jun. 25, 1985.

Aspects of Linear Cyclic Codes

A code C is said to be a linear cyclic code if the cyclic shift of each codeword is also a codeword. If each codeword u in C is of length n, then the cyclic shift $\pi(u)$ of u is the word of length n obtained from u by shifting the last digit of u and moving it to the beginning, all other digits moving one position to the right.

| U | 10110 | 111000 | 0000 | 1011 |
|---|-------|--------|------|------|
| $\pi(u)$ | 01011 | 011100 | 0000 | 1101 |

It is possible to build a linear code and achieve an equivalent effect to that of shifting if every codeword c(x) in an (n,k) linear cyclic code over K=(0,1) is generated by dividing a block of binary data m(x) by a generator polynomial g(x) and adding the remainder thereto modulo 2, where c(x) is a polynomial of degree n-1 or less, where $m(x)=a_0+a_1x+a_2x^2+\ldots+a_{(n-r-1)}x^{(n-r-1)}$, and where $g(x)=b_0+b_1x+b_2x^2+\ldots+b_rx^r$ such that c(x) is divisible by g(x). This means that $c(x)=x^r m(x)+r(x)$. As can be seen, the codewords are conventionally represented as the coefficients of a rational polynomial of an arbitrary place variable x in low to high order in the same manner as m(x) and g(x).

Significantly, a received codeword c"(x)=c(x)+e(x), where c(x) is the word that was originally recorded or transmitted and e(x) is the error. Relatedly, a syndrome polynomial S(x) is defined informally as S(x)=c"(x) mod g(x). Thus, c"(x)=c(x) if and only if g(x) divides into c"(x) with a remainder of zero. i.e. S(x)=0. Otherwise, it can be shown that the polynomial S(x) is dependent only upon the error polynomial function.

Patel '838 Patent and Two Levels of Check Byte Error Detection and Correction

Attention is now directed to the above-identified Patel '838 patent. Parenthetically, Patel et al. is incorporated into this specification by reference.

Patel discloses an apparatus for detecting and correcting multiple bytes in error in long byte strings read back from a disk drive. Prior to recording the byte strings on disk, they are formatted into a two-level block/subblock code structure. Thus, equal-length data words are mapped into codewords from a linear error correction code such as a Reed-Solomon (RS) code. A fixed number of these codewords, including their check bytes, are byte interleaved to form a subblock. In turn, a given number of subblocks are concatenated and check bytes taken over all of the subblocks are appended thereto to form a block.

In Patel, each subblock comprises at least two byte-interleaved message words and check bytes. In order to correct $t_1$ errors in a codeword, $2t_1$ check bytes must be calculated from the message word and appended to form the codeword. This means that each subblock can correct up to $t_1$ bytes in error. Also, each block consists of a predetermined number of subblocks and block check bytes. In this regard, the block check bytes are computed over all of the subblocks as a modulo 2 accumulation as specified by a pair of modulo 2 matrix equations (col. 10, lines 10–16).

Patel's advance is the use of syndromes derived from block-level check bytes to detect and correct errors in the RS codewords when the errors exceed the recovery capacity of the check bytes at any one of the subblocks. He identifies four situations spanning the occurrence of error and the block and subblock check bytes. These are:

(1) no error occurrence in any of the subblocks (col. 9, lines 14–23);

(2) no more than $t_1$ bytes in error occur within any word within one subblock and are corrected (col. 9, lines 24–28);

(3) more than $t_1$ bytes in error have occurred within any word within one subblock and the error is not resolved at the subblock level of error processing, but is detected by the syndromes of the block-level check bytes (col. 9, lines 29–55); and (4) where more than $t_1$ bytes in error have occurred within a word within any one subblock (col. 9, lines 56–65).

Situations (2)–(4) emphasize that the correctability of bytes in error is a function of error distribution within a subblock. Assume that $t_1$ is the number of correctable errors in a codeword. If at least $(t_1+1)$ bytes in error are distributed as $t_1$ error bytes in the first word and one byte in error for the second word, then each word would be correctable. However, if a run of $(t_1+1)$ errors occurred in say the second word alone then it would not be correctable at the subblock level.

Patel describes the relationship between subblock-level and block-level correction. In this regard, he uses the variable $t_1$ as the number of subblock correctable errors, while $t_2$ is the number of correctable errors at the block level. He points out (col. 10, lines 39–48) that:

"The combined capability of the two-level system provides correction of any combination of $(t_1+x)$ errors in any one subblock, any combination of up to $(t_1-x)$ errors in each of the other subblocks, and y errors in the block-level check bytes. It should be noted that x and y are integers in the range $0 \leq x \leq (x+y) \leq (t_2-t_1)$. The subblock-level code has a distance of $d_1=2t_1+1$, while the block-level code has a distance between codewords of $d_2=2t_2+1$."

For purposes of completeness, it is noted that Patel provides a sanguine proof (col. 11, lines 17–67) of the ability of block-level check bytes defined over all of the codewords in a subblock to aid in the detection and correction of errors exceeding the capacity of any single codeword but within the combined codeword/block-level capacities.

As mentioned above, the block-level check bytes in the Patel '838 patent are determined by a computation outside of the Reed-Solomon or other linear coding process. That is, Patel does not use the same code process for generating the codewords and check bytes at the subblock level as is used to derive the block-level check bytes.

In practice, a predetermined number of RS codewords are interleaved and recorded as a subblock or block on a track of a magnetic or optical disk drive or tape transport. Currently in many storage disk drives, three codewords at a time are interleaved. When read back from the storage device, the codewords must be demultiplexed. In this specification, all of the fixed-length data byte strings m(x) that are to be error correction encoded, recorded on a storage device, and read back are assumed to be of equal length. Each string can be represented by a polynomial m(x), while the redundant or remainder bytes designated r(x) are obtained during a linear encoding process of dividing m(x) by a predetermined generator polynomial g(x), where x is a placeholder variable. Thus, each linear codeword $c(x)=x^r m(x)+r(x)$.

SUMMARY OF THE INVENTION

It is an object of this invention to devise a method and means for enhancing the error detection and correction capability obtained when a plurality of data byte strings are encoded in a two-level, block-formatted linear code using codeword and block-level redundancy.

It is a related object that such method and means permit detection and correction whereby (a) either no bytes are in error within each of the codewords within a block, (b) any bytes in error in any single codeword are within the correction capability of either the codeword level or the combination correction capabilities of both levels, or (c) signal indication is given of the fact that the bytes in error in any single word exceed the correction capability of both levels.

It is yet another object that such method and means provide an error detection and correction capability even where the block-level redundancy is in error.

In the 1976 paper by Blokh and Zybalov, "Coding of Generalized Concatenated Codes", appearing in the Russian periodical *Problems of Information Transmission*, Vol. 10, No. 3, pp. 45–50, the authors describe the encoding of a plurality of parallel datastreams using a concatenated encoder. In this arrangement, the datastreams are separately encoded using a single encoder and the logical sum of the datastreams is separately encoded by yet another encoder. An aspect of this invention is premised on the observation that if all of the encoded outputs are logically summed again, then the redundancy of the encoded sum will contain the redundancy shared by all the datastreams as well as the redundancy of any particular datastream.

The method and means of the invention disclosed and claimed in this specification are directed to a new use and apparatus employing the concatenated encoder attributes as described in the Blokh and Zybalov article with some apparatus modifications. That is, the new use is related to the generation of block-level checks within the same code generation scheme unlike that described in the above-discussed Patel '838 patent or in the related patent by Abdel-Ghaffar et al., U.S. Pat. No. 4,951,284, "Method and Means for Correcting Random and Burst Errors", issued Aug. 21, 1990.

In the method and means of this new use, two $m_1(x)$ and $m_2(x)$ of three datastreams are encoded by a first Reed-Solomon (RS) linear encoder producing respective codewords $c_1(x)$ and $c_2(x)$. This first RS encoder appends $2t_1$ checks to each of the codewords. The third datastream $m_3(x)$ is modified to form the logical (modulo 2) sum of $m_1(x)$ $\oplus m_2(x) \oplus m_3(x)$ prior to encoding by a second RS encoder. This second RS encoder includes $2t_1+2t_2$ checks within the codeword c'(x) of the logically-summed datastream. The codeword $c_3(x)$ represents the logical sum of the three codewords $c_1(x) \oplus c_2(x) \oplus c'(x)$. This third codeword $c_3(x)$ contains $2t_2$ shared block checks and $2t_1$ individual checks when generated in this manner. Significantly, the block checks are inside and an intrinsic part of the RS codeword. This aspect is missing from both the Patel '838 and the Abdel-Ghaffar et al. '284 patents, as well as from the Russian paper. The combined redundancy would then be available to detect and correct a larger number of errors than had the same redundancy been distributed only among the codewords individually.

Thus, two of the codewords $c_1(x)$ and $c_2(x)$ are linearly error correction encoding of respective data byte strings $m_1(x)$ and $m_2(x)$ to correct up to $t_1$ bytes in error and require $2t_1$ check bytes. The codeword c'(x) is the linear encoding of the modulo 2 sum of $m_1(x)$, $m_2(x)$, and $m_3(x)$ to correct up to $t_1+t_2$ bytes in error and requires $2t_1+2t_2$ check bytes. Data byte strings $m_1(x)$ and $m_2(x)$ are appended with $2t_2$ zeroes denoted by $\phi(x)$ in order to secure equal codeword length. The codeword outputs may then be expressed as:

$$c_1(x)=x^{2t_1+2t_2}m_1(x)+\phi(x)+r_1(x)$$

$$c_2(x)=x^{2t_1+2t_2}m_2(x)+\phi(x)+r_2(x)$$

$$C'(x)=x^{2t_1+2t_2}[m_1(x)+m_2(x)+m_3(x)]+r'(x)$$

The codeword c'(x) is further processed to produce a modified and third codeword $c_3(x)$ by summing the three codewords $c_1(x)$, $c_2(x)$, and c'(x) modulo 2 such that:

$$c_3(x)=[c_1(x)+c_2(x)]+c'(x)=x^{2t_1+2t_2}m_3(x)+r_B(x)+r_3(x)$$

Lastly, an integrated interleaved block of codewords $c_1(x)$, $c_2(x)$, and $c_3(x)$ is written out to the disk. Subsequently, when the disk must execute a read or read modify write command or the like, an addressed block or blocks of codewords are streamed from their track locations on the disk where any errors are detected and corrected on the fly based on the syndrome processing of the codewords.

More particularly, the foregoing objects are satisfied by a method and means for detecting and correcting multibyte errors in long byte strings recorded on a moving storage medium of a storage device in blocks. Each block comprises a plurality of codewords and a plurality of block-level check bytes derived from the codewords. In turn, each codeword includes data bytes and codeword check bytes mapped from a plurality of equal-length data byte strings according to a linear error correction code.

The method and means generating and recording each block is responsive to the plurality of data byte strings. This involves logically summing the data byte strings and mapping the logical sum and the data byte strings into counterpart codewords including codeword check bytes in accordance with the same linear error correction code. Next, the codewords are logically summed. The codewords and their logical sum are interleaved in a predetermined pattern prior to being recorded on a storage device or the like.

The method and means further contemplate accessing each block from the storage medium on an opportunistic or scheduled basis and processing the accessed block to detect and correct incipient bytes in error. This requires deriving syndromes from the purported codewords and their logical sum modulo 2 and identifying any nonzero syndromes. It further requires processing any identified nonzero syndromes over the codewords to correct any bytes in error. It still further requires processing any updated block-level nonzero syndromes to locate and correct bytes in error in any single codeword exceeding the correction capability of the codeword. The errors nevertheless in this case are within the combined correction capability of the block and a single codeword. Also, signal indication is provided where the bytes in error exceed the correction capability of both the codeword and block levels. Lastly, because both block-level and code-level check bytes are generated as part of a linear cyclic coding process such as in the Reed-Solomon code, any check bytes in error will result in a nonzero syndrome.

BRIEF DESCRIPTION OF THE DRAWING

FIG. 2 shows a high-level logic flow forming an integrated interleaved datastream in the DASD write path of linear ECC codewords with enhanced detection and correction capability according to the method and means of the invention.

FIGS. 3A and 3B respectively illustrate another embodiment of the RS encoder arrangement shown in FIG. 2 for generating on-the-fly a datastream of integrated interleaved linear ECC codewords and the format of the datastream produced as a buffered arrangement of the encoder output.

DESCRIPTION OF THE PREFERRED EMBODIMENT

Figure 1:
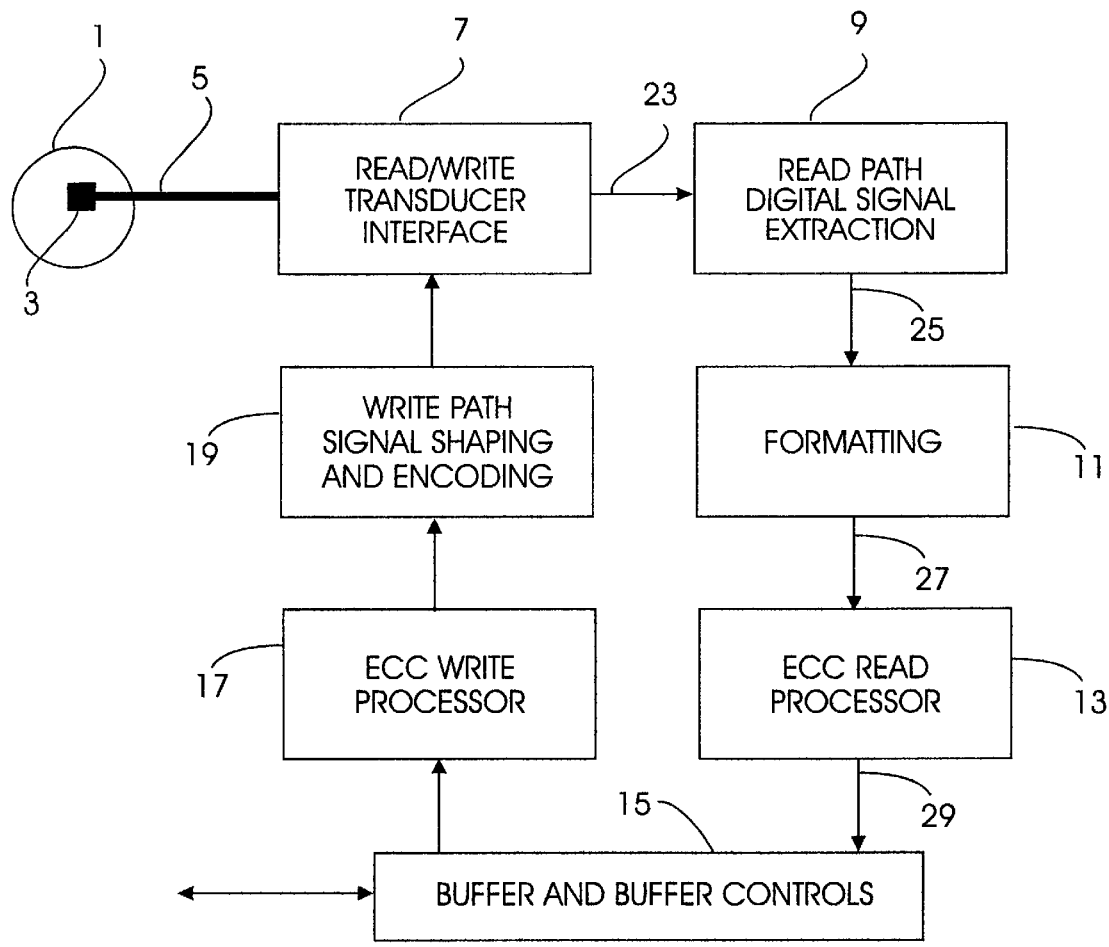
FIG. 1 depicts a prior art partial data flow in the write and read paths of a disk drive for an on-the-fly calculation and appending of check bytes to form and record linear ECC codewords and the detection and correction of linear ECC codewords read from the disk tracks.

Referring now to FIG. 1, there is shown a partial logical view of a disk drive and a portion of the read and write paths according to the prior art. A disk drive, also termed a direct access storage device, comprises a cyclically-rotated magnetic disk 1, a radial or axially movable access arm 5 tipped with an electromagnetic transducer 3 for either recording magnetic flux patterns representing sequences of digital binary codewords along any one of a predetermined number of concentric tracks on the disk, or reading the recorded flux patterns from a selected one of the tracks and converting them into codewords.

When sequences of digital binary data are to be written out to the disk 1, they are placed temporarily in a buffer 15 and subsequently processed and transduced along a write path or channel (17, 19, 7, 5, and 3) having several stages. First, a predetermined number of binary data elements, also termed bytes, in a data string are moved from the buffer and streamed through the ECC write processor 17. In processor 17, the data bytes are mapped into codewords drawn from a suitable linear block or cyclic code such as a Reed-Solomon code. This is well appreciated in the prior art. Next, each codeword is mapped in the write path signal-shaping unit 19 into a run length limited or other bandpass or spectral-shaping code and changed into a time-varying signal. The time-varying signal is applied through an interface 7 and thence to the write element in a magnetoresistive or other suitable transducer 3 for conversion into magnetic flux patterns.

All of the measures starting from the movement of the binary data elements from buffer 15 until the magnetic flux patterns are written on a selected disk track as the rotating disk 1 passes under the head 3 are synchronous and streamed. For purposes of efficient data transfer, the data is destaged (written out) or staged (read) a disk sector at a time. Thus, both the mapping of binary data into Reed-Solomon codewords and the conversion to flux producing time-varying signals must be done well within the time interval defining a unit of recording track length moving under the transducer. Typical units of recording track length are equal fixed-length byte sectors of 512 bytes.

When sequences of magnetic flux patterns are to be read from the disk 1, they are processed in a separate so-called read path or channel (7, 9, 11, and 13) and written into buffer 15. The time-varying signals sensed by transducer 3 are passed through the interface 7 to a signal extraction unit 9. Here, the signal is detected and a decision is made as to whether it should be resolved as a binary 1 or 0. As these 1's and 0's stream out of the signal extraction unit 9, they are arranged into codewords in the formatting unit 11. Since the read path is evaluating sequences of RS codewords previously recorded on disk 1, then, absent error or erasure, the codewords should be the same. In order to test whether that is the case, each codeword is applied to the ECC read processor 13 over a path 27 from the formatter. Also, the sanitized output from the ECC processor 13 is written into buffer 15 over path 29. The read path must also operate in a synchronous datastreaming manner such that any detected errors must be located and corrected within the codeword well in time for the ECC read processor 13 to receive the next codeword read from the disk track. The buffer 15 and the read and write paths may be monitored and controlled by a microprocessor (not shown) to ensure efficacy where patterns of referencing may dictate that a path not be taken down, such as sequential read referencing. However, such is beyond the scope of the present invention.

Referring now to FIG. 2, there is shown an ECC write processor 17 modified, however, to illustrate the principles of the invention. The ECC processor in FIG. 2 comprises three Reed-Solomon encoders 103, 109, and 115. For the purposes of illustration, the parameters $2t_1$ and $2t_2$ will be set equal to 10, The encoders are each defined by their generating polynomial g(x). In this regard, encoders 115 and 109 have the same polynomial, namely, $$g(x) = \prod_{i=0}^{2t_1-1=9} (x-a^i).$$

Encoder 103 is governed by the polynomial:

$$g(x) = \prod_{i=0}^{2t_1+2t_2-1=19} (x-a^i).$$

As previously discussed, the RS encoding action consists of creating a codeword $c_j(x)=x^r m(x)+r_j(x)$. In this regard, r(x) is obtained by dividing a copy of a data byte stream $m_j(x)$ by the generating function g(x) and appending the remainder $r_j(x)$. The codeword outputs from encoders 115, 109, and 103 are respectively designated $c_1(x)$, $c_2(x)$, and $c'(x)$. In this embodiment, three equal-length data byte strings $m_1(x)$, $m_2(x)$, and $m_3(x)$ are concurrently applied on respective paths 113, 107, and 102 a byte at a time. That is, $m(x)=m_1(x) \oplus m_2(x) \oplus m_3(x)$. In order to secure equal-length codewords, the two datastreams $m_1(x)$ and $m_2(x)$ need to have appended to each of them $2t_2=10$ zeroes denoted by $\phi(x)$ prior to their encoding since the encoders 115 and 109 append $2t_1=10$ checks to $m_1(x)$ and $m_2(x)$. Then the resulting codewords are expressed as:

$$c_1(x)=x^{20}m_1(x)+\phi(x)+r_1(x)$$

$$c_2(x)=x^{20}m_2(x)+\phi(x)+r_2(x).$$

The logical sum $m(x)$ is encoded by encoder 103. This encoder appends to it $2t_1+2t_2=20$ checks, resulting in an intermediate expression $c'(x)=x^{20}m(x)+r(x)$. The codeword $c_3(x)$ is obtained as the logical sum of XOR gate 105 and is expressed as:

$$c_3(x)=c'(x) \oplus c_1(x) \oplus c_2(x) = x^{20}[m_3(x)+r_B(x)+r_3(x)].$$

The check bytes $r_B(x)$ are the block checks shared by $m_1(x)$, $m_2(x)$, and $m_3(x)$, whereas $r_3(x)$ are the individual check bytes of datastream $m_3(x)$.

Structurally, each of the input paths 113, 107, and 102 is also terminated in an XOR gate 101. This provides an input $m(x)$ to the RS encoder 103 where $m(x)$ is the binary sum modulo 2 of all three byte strings $m_1(x)$, $m_2(x)$, and $m_3(x)$. That is, $m(x)=(m_1(x)+m_2(x)+m_3(x))$ modulo 2. As a consequence of the operations performed within the encoder 103, the string $m(x)$ is shifted $2t_2=20$ positions or $x^{20}m(x)$ and a remainder $r(x)$ is formed. Thus, $$c'(x)=x^{2t_1+2t_2}m(x)+r(x)=m(x)+r(x).$$

Generically, the concurrent outputs $c_2(x)$ and $c_1(x)$ from encoders 109 and 115 are, respectively:

$$c_2(x)=x^{20}m_2(x)+\phi(x)+r_2(x);$$

$$c_1(x)=x^{20}m_1(x)+\phi(x)+r_1(x).$$

Imposing on the encoder outputs the dual of the XOR input operation, and copies of the encoder outputs $c_1(x)$ and $c_2(x)$ are applied to a second XOR gate 105. The output of the second XOR gate 105 is designated as $c_3(x)$ and may be expressed as:

$$c_3(x)=c'(x)+[c_1(x)+c_2(x)].$$

Referring now to FIGS. 3A and 3B, there is respectively illustrated another embodiment of the RS encoder arrangement shown in FIG. 2 for generating on the fly a datastream of integrated interleaved linear ECC codewords and the format of the datastream produced as a buffered arrangement of the encoder output. In the RS encoder arrangement in FIG. 2, one of the paths, namely that involving the first and second XOR gates 101 and 105 and encoder 103, is configured differently from the paths involving encoders 109 and 115. Also, encoder 103 has a generating polynomial $g(x)$ spanning 20 roots rather that the 10 associated with the $g(x)$ for encoders 109 and 115.

The embodiment shown in FIG. 3A avoids the logical combining operation 15 performed by XOR gate 105 in the embodiment shown in FIG. 2. In this regard all of the XOR operations in the FIG. 3A apparatus are executed prior to releasing the check byte data. This result is made possible through the use of the programmable RS encoder as disclosed in Cox et al., U.S. Pat. No. 5,444,719, "Adjustable Error-correction Composite Reed-Solomon Encoder/Syndrome Generator", issued Aug. 22, 1995.

In the embodiment shown in FIG. 3A, a plurality of the encoders or RS codeword generators 201, 203, and 205 all use the same generating polynomial $g(x)$. This polynomial is of the form:

$$g(x)=\prod_{i=0}^{9}(x-a^i).$$

The encoder 207 is described by the polynomial:

$$g(x)=\prod_{i=10}^{19}(x-a^i).$$

While the data byte streams $m_1(x)$, $m_2(x)$, and $m_3(x)$ are being processed by respective encoders on paths 113, 107, and 102 by encoders 201, 203, and 205, the block check generator or encoder 207 is first generating block check bytes over the modulo 2 sum of the datastreams over a path including XOR 209, switch S4, output 239, and encoder input 241. At this point in time, the input to the encoder 207 is $m(x)=(m_1(x)+m_2(x)+m_3(x))$ modulo 2.

After this, encoder 207 input 241 is switchably changed to generating check bytes over a modulo 2 sum of the codeword outputs from encoders 201, 203, and 205 over a path including XOR gate 211 terminating paths 235, 233, and 231 as controlled by switches S5, S6, and S7. The output of encoder 207 is now switched to path 213. This output contains a "tail" of block check bytes $r_B(x)$ over all the codewords, including their check bytes. The physical outputs are written into a formatting buffer (not shown) where they can be preferentially arranged to follow a predetermined interleave pattern. One such pattern is illustrated in FIG. 3B.

Referring now to FIG. 3B, there is shown the output of the encoding arrangement in FIG. 3A. In this format, the three data byte streams are written as $m_1(x)$, $m_2(x)$, and $m_3(x)$ followed by block checks $r_B(x)$ spanning the codewords and the codeword check bytes, and lastly the codeword check bytes $r_1(x)$, $r_2(x)$, and $r_3(x)$. This format is generically expressed in FIG. 3B as a mixed field and check byte interleave comprising a plurality of datastream phases $m_1$, $m_2$, and $m_3$ followed by block checks $r_B(x)$ spanning the phases and the local check bytes. The critical distinction is that both the block and codeword check bytes arise out of the same linear code-generating process.

Figure 4:
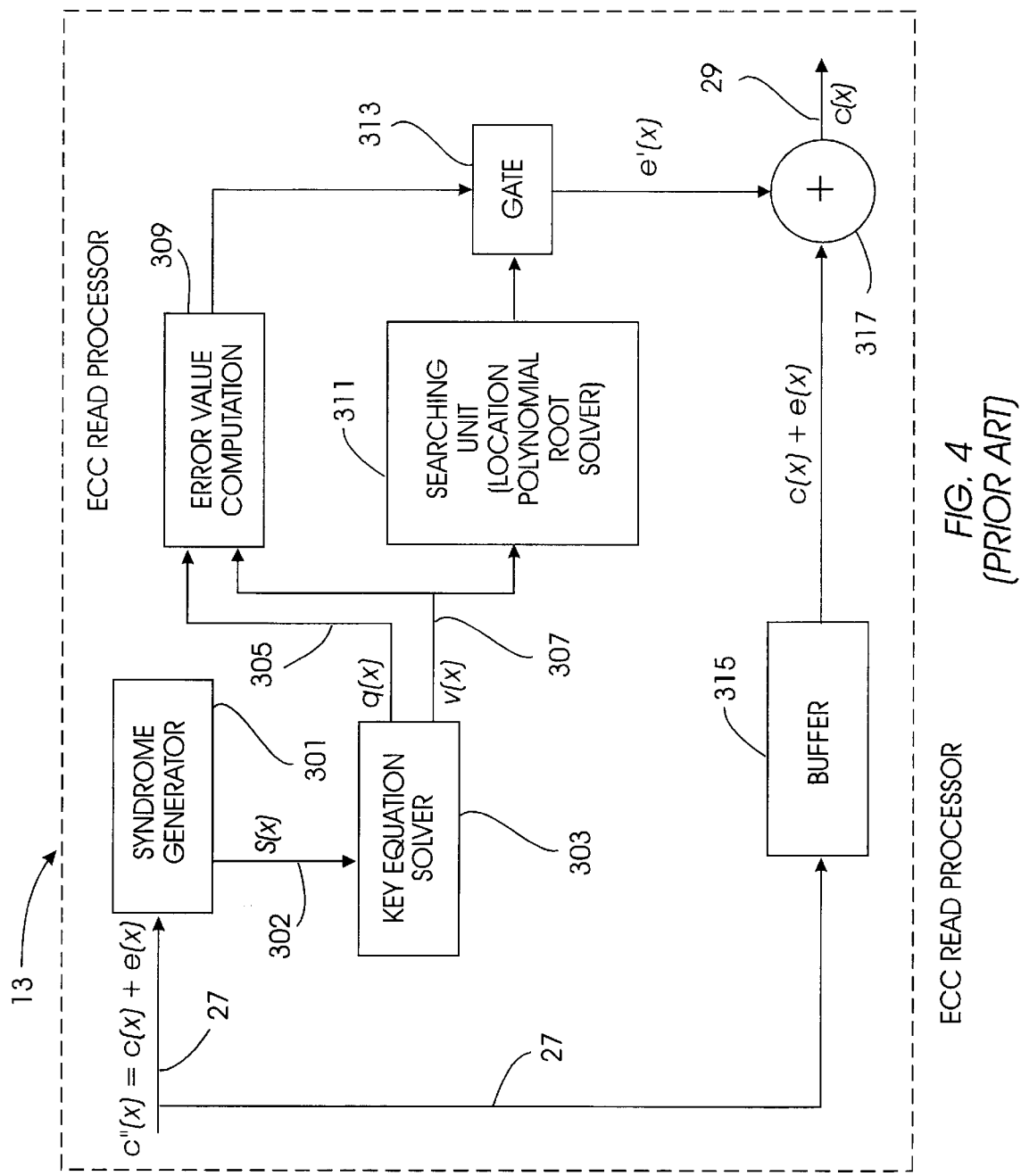
FIG. 4 depicts the detection and correction of linear ECC codewords in the read path of a disk drive or DASD utilizing on-the-fly calculation of syndromes and the location and value of any errors derived from the syndromes to enable correction also as appreciated in the prior art.

Referring now to FIG. 4, there is depicted the detection and correction of linear ECC codewords in the read path of a disk drive or DASD. This utilizes on-the-fly calculation of syndromes and the location and value of any errors derived from the syndromes to enable correction, also as appreciated in the prior art.

In the prior art Reed-Solomon decoder of FIG. 4, there is respectively set out a portion of the ECC processor 13 in the DASD read path relating to detecting and correcting errors in received codewords according to the prior art. In this embodiment, each received codeword $c(x)+e(x)$ is simultaneously applied over input path 27 to syndrome generator 301 and buffer 315. Here, each received word logically consists of the codeword $c(x)+$an error component $e(x)$. If $e(x)=0$, then the codeword $c(x)$ is valid.

In FIG. 4, the purpose of the internal buffer 315 is to ensure that a time-coincident copy of the codeword $c''(x)$ is available for modification as the codeword leaves the unit on path 29 for placement in the DASD buffer 15, as shown in FIG. 1. The detection of error is provided by the syndrome generator 301. The polynomials constituting the error value and error location inputs are derived from the syndromes by the key equation solver 303. Next, an error value computation unit 309 and a root solver 311 determine the error values and their locations within the received codeword, respectively. The outputs of the error value computation and the root locations (location within the codeword of the detected errors) are jointly applied through a gate 313 and logically combined with a time-delayed version of c(x)+e(x) at an OR gate 317.

In general, the process represented by the ECC read processor embodiment is an example of time-domain decoding and is well appreciated in the prior art. Attention is also directed to Hassner et al., U.S. Pat. No. 5,428,628, "Modular Implementation for a Parallelized Key Equation Solver for Linear Algebraic Codes", issued Jun. 27, 1995. Hassner describes designs for respective syndrome detection, key equation solving, error value computation, and most significantly for error location. See also Clark and Cain, "Error Correction Coding for Digital Communications", Plenum Press, Inc., 1981, pp. 189–215.

Figure 5:
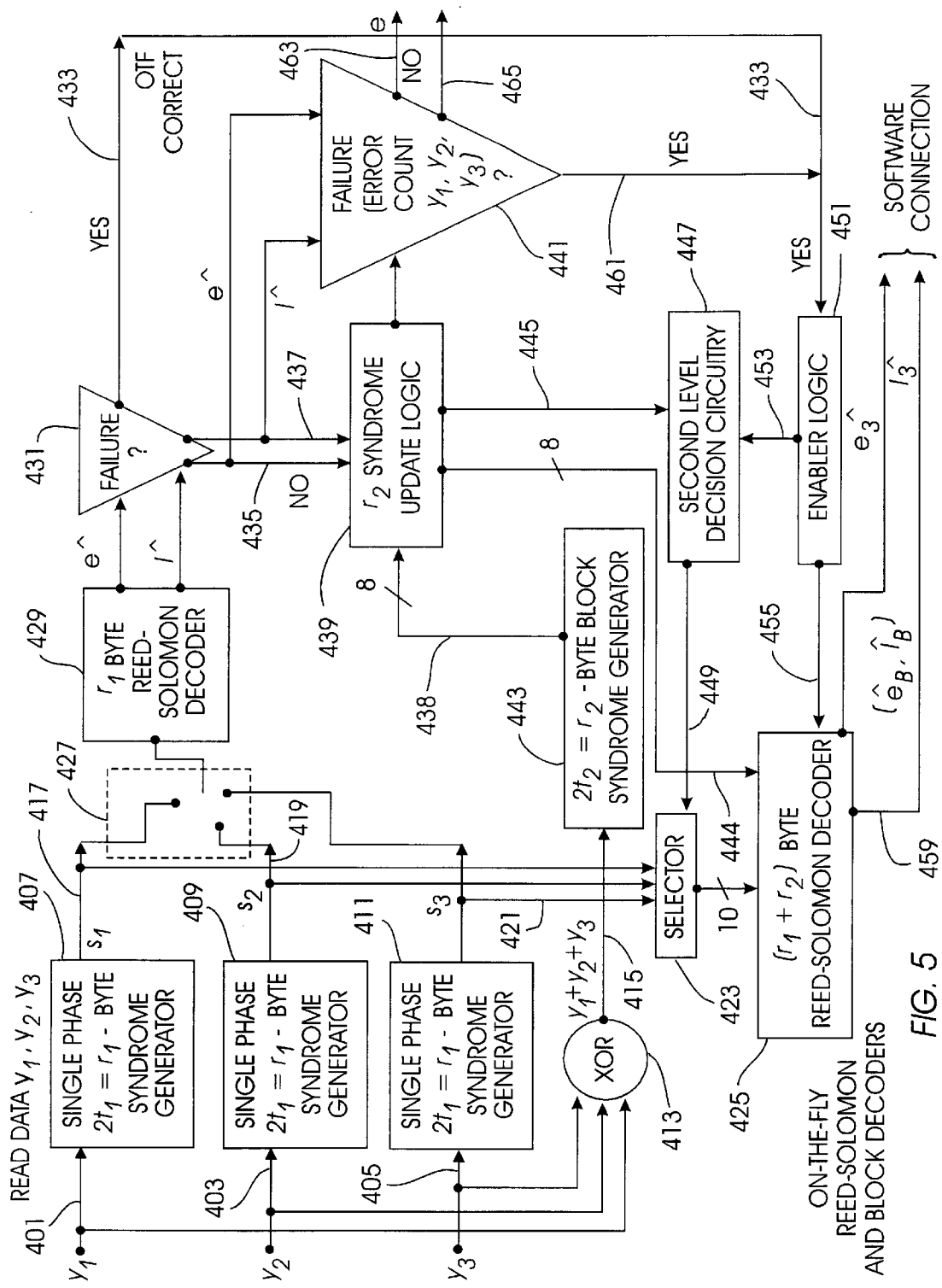
FIG. 5 shows a decoder arrangement for generating error and location values from syndromes detected in any of the codewords forming the interleaved multiple or those which exceed the capacity of any single codeword, but are within the capacity of the interleaved multiple or those errors which exceed the correction capability.

Referring now to FIG. 5, there is shown a decoder arrangement for generating error and location values from syndromes detected in any of the codewords forming the interleaved words in a block according to the invention. Prior to processing blocks in ECC read processor 13, they must first be read back from disk 1 and "demultiplexed" in formatter 11. This will separate out the data byte strings, the block checks, and the codeword check bytes so that they can be validity tested.

The decoder arrangement (ECC read processor 13) comprises three byte syndrome generators 407, 409, and 411 for ascertaining the syndrome set $s_1$, $s_2$, $s_3$ over the received codewords $y_1$, $y_2$, and $y_3$ as applied on paths 401, 403, and 405. Concurrently, a modulo 2 sum of $y_1$, $y_2$, and $y_3$ is derived from XOR gate 413 and applied to a block syndrome generator 443 over path 415. In turn, the syndromes derived from the codewords are applied to a Reed-Solomon (RS) decoder 429 over switch 427. The syndromes derived over all the codewords and block checks are applied to another RS decoder 425. This represents a significantly enhanced Reed-Solomon encoding of data capable of detecting and correcting more errors.

In this embodiment, RS decoder 429 processes the non-zero syndrome output from any one of the selected generators 407, 409, and 411. It has the capacity to correct up to $r_1/2=t_1$ bytes in error in any single codeword. Concurrently, generator 443 produces any nonzero syndromes based on the $r_2$ check bytes in the block derived from the modulo 2 sum of the received codewords $y_1$, $y_2$, and $y_3$ through XOR gate 413. These syndromes are modified by syndrome update logic 439 to remove the effects of any errors located by RS decoder 429. If the updated symdromes are zero, the correction computed by RS decoder 429 is deemed correct. If, however, the syndromes are nonzero or if the RS decoder 429 detects failure. then the $r_1$ syndromes in the phase that failed and $r_2$ block syndromes are applied respectively through selector 423 and generator 443 to RS decoder 425.

This is done in several ways:

(1) if detector 431 indicates that any of the codewords $y_1$, $y_2$, or $y_3$ were uncorrectable; or (2) if detector 431 does not show a failure but that detector 441 does show a failure, then the codeword that had the most number of corrections is chosen for the second level correction. To effectuate this second level, RS decoder 425 is activated over path 455 by enabler logic 451.

In both cases, RS decoder 425 will effectuate correction up to $(r_1+r_2)/2$ bytes in error. That is, a copy of $r_2$ syndromes from generator 443 is operative as second level protection. The copy is used to check the on-the-fly RS decoder 429 as indicated by the state of syndrome update logic 439.

The second level decision circuitry 447 codeword among $y_1$, $y_2$, or $y_3$ is to be selected for correction. It directs the selector 423 in the use of the $r_1$ first level syndromes for the selected codeword.

In the rare circumstance where the number of errors exceeded the capability of RS decoder 425, i.e., $(r_1+r_2)/2$ errors, then signal indication of the noncorrectability must be provided to the drive controller (not shown).

Parenthetically, implementation of a Reed-Solomon decoder is a matter of design choice. In this regard, since the codeword rate is higher than the block rate, then an on-the-fly hardware implementation would be appropriate. However, where the error patterns exceed the correction capability of the first-level RS decoder 429, they present a range of correction choices more complicated since they may involve a higher level of correction. In these circumstances, a software RS decoder implementation on a dedicated microprocessor offers the flexibility necessary in analyzing and correcting complex error patterns.

While the invention has been described with respect to a disk storage device as an illustrative embodiment thereof, it will be understood that various changes may be made in the method and means herein described without departing from the scope and teaching of the invention. Thus, the principles of this invention also pertain to the detection and correction of errors in linearly error correction encoded long byte strings, such as received from a communication system or the like. Accordingly, the described embodiment is to be considered merely exemplary and the invention is not to be limited except as specified in the attached claims.

What is claimed is:

1. A method for detecting and correcting multibyte errors in long byte strings either derived from a communications system or recorded on a moving storage medium of a storage device in blocks, each block comprising a plurality of codewords and a plurality of block-level check bytes derived from the codewords, each codeword including data bytes and codeword check bytes mapped from a plurality of equal-length data byte strings according to a linear error correction code, comprising the steps of:

(a) generating and either transmitting on the system or recording on the storage medium each block responsive to the plurality of data byte strings including the substeps of:

(a1) logically summing the data byte strings and mapping the logical sum and the data byte strings into counterpart codewords including codeword check bytes and a coded logical sum including block-level check bytes in accordance with the same linear error correction code;

(a2) logically summing the codewords including the coded logical sum and interleaving the codewords including codeword check bytes, the logical sum, and the block-level check bytes in a predetermined interleave pattern; and (b) accessing each block either from the system or from the storage medium on an opportunistic or scheduled basis and processing the accessed block to detect and correct incipient bytes in error including the substeps of:

(b1) deriving syndromes from the check bytes therein and identifying any nonzero syndromes; and (b2) processing any identified nonzero syndromes over the codewords to correct any bytes in error using the codeword check bytes, and processing any block-level nonzero syndromes either to locate and correct bytes in error in any single codeword exceeding the correction capability of the codeword but within the capability of the block, or to indicate that the bytes in error exceed the correction capability of both the codeword and block levels.

2. The method according to claim 1, wherein all encoding and syndrome processing operations are performed according to the rules of Galois field arithmetic, and further wherein said logical summing is in the form of modulo 2 addition, and still further wherein the linear error correction code is a linear cyclic code of the Reed-Solomon type.

3. The method according to claim 1, wherein said predetermined interleave pattern of codewords in step (a2) includes (1) codewords formed from a counterpart data byte string and codeword check bytes, and (2) coded logical sums including their block-level check bytes, and still further wherein said pattern constituting any block includes an interleaving pattern selected from a set consisting of a Galois field of symbols constituting a Reed-Solomon code as exemplified by symbol byte interleaved, and mixed field and check byte interleaved patterns.

4. The method according to claim 3, wherein said predetermined pattern of each block is formed from a mixed field and check byte interleave pattern, said pattern comprising three codewords and block check bytes in the concatenated order of the data byte strings, the block check bytes, and the codeword check bytes (FIG. 3B).

5. The method according to claim 1, wherein the step (b1) comprises the substeps of:

(b1a) demultiplexing the purported codewords;

(b1b) logically summing the purported codewords to form the purported sum; and (b1c) deriving syndromes from the purported codewords and syndromes from the logical sum, and identifying any nonzero syndromes from the purported codewords.

6. The method according to claim 1, wherein step (b2) comprises the substeps of:

(b2a) generating first error location and value indicia as a function of any identified purported codeword nonzero syndromes within the correction capability of the codeword;

(b2b) generating second error location and value indicia as a function of the purported block check bytes nonzero syndromes and the first bytes in error and value indicia for those bytes in error exceeding the correction capability of the codeword but within the correction capability of the block check bytes.

7. A method for detecting and correcting multibyte errors in long byte strings either transmitted on a communications system or recorded on a moving storage medium of a tracked storage device in blocks, each block comprising a plurality of codewords $c_1(x)$, $c_2(x)$, and $c_3(x)$ and a plurality of block-level check bytes derived from the codewords, each codeword $c_1(x)$, $c_2(x)$, and $c_3(x)$ being mapped from a plurality of equal-length data byte strings $m_1(x)$, $m_2(x)$, and $m_3(x)$ according to a linear cyclic error correction code in a Galois field, comprising the steps of:

(a) generating (FIG. 2) and either transmitting or recording each block responsive to the data words $m_1(x)$ and $m_2(x)$ including the substeps of:

(a1) applying $m_1(x)$ and $m_2(x)$ to a first and a second linear cyclic encoder (115, 119), respectively, and computing counterpart codewords $c_1(x)$ and $c_2(x)$ on the fly for correcting up to $t_1$ errors such that:

$$c_1(x) = x^{2t_1} m_1(x) + r_1(x)$$
$$c_2(x) = x^{2t_1} m_2(x) + r_2(x)$$

and where the first and second encoders have respective code-generating polynomials $g_1(x)$ and $g_2(x)$ of the form:

$$g_1(x) = \prod_{i=0}^{2t_1-1} (x - a^i)$$

$$g_2(x) = \prod_{i=0}^{2t_1-1} (x - a^i)$$

and where $r_1(x)$ and $r_2(x)$ are the remainders operative as check bytes and derived from the operations of $m_1(x)/g_1(x)$ and $m_2(x)/g_2(x)$;

(a2) forming a dataword $m(x)$ as the modulo 2 sum of $m_1(x)$, $m_2(x)$, and $m_3(x)$, applying the formed dataword $m(x)$ to a third linear cyclic encoder, and computing a counterpart codeword $c'(x)$ on the fly such that:

$$c'(x) = x^{2t_1+2t_2} m(x) + r(x)$$

where the third encoder has a code-generating polynomial $g_3(x)$ of the form:

$$g_3(x) = \prod_{i=0}^{2t_1+2t_2-1} (x - a^i)$$

where $r(x)$ is the remainder operative as check bytes and derived from the operations of $m(x)/g_3(x)$;

(a3) forming a codeword $c_3(x)$ as the Boolean sum of $c_1(x)$, $c_2(x)$, and $c'(x)$ and interleaving and concatenating the codewords $c_1(x)$, $c_2(x)$, and $c_3(x)$ including the block check bytes in a predetermined interleave pattern as a block for correcting up to $t_1+t_2$ errors in any codeword;

(b) accessing each block either from the communications system or from the storage medium on an opportunistic or scheduled basis and for processing the accessed block to detect and correct incipient bytes in error, and further including the substeps of:

(b1) deriving syndromes from the accessed codewords and their logical sum therein, and identifying any nonzero syndromes; and (b2) processing any identified nonzero syndromes over the codewords to correct any bytes in error using the codeword check bytes, and processing any block-level nonzero syndromes either to locate and correct bytes in error in any single codeword exceeding the correction capability of the codeword or to indicate that the bytes in error exceed the correction capability of both the codeword and block levels.

8. The method according to claim 7, wherein t lies in the closed integer interval from 0 to $2t_1-1=9$, and further wherein the linear cyclic error correction code is of the Reed-Solomon type.

9. The method according to claim 7, wherein said predetermined interleave pattern constituting any block includes an interleaving pattern selected from the set consisting of bit interleaved, byte interleaved, and mixed field and check byte interleaved patterns.

10. The method according to claim 9, wherein said predetermined pattern of each block is formed from a mixed field and check byte interleave pattern, said pattern comprising three codewords and block check bytes in the concatenated order of the data byte strings, the block check bytes, and the codeword check bytes (FIG. 3B).

11. In a tracked, formatted storage device having an apparatus for detecting and correcting multibyte errors in long byte strings recorded in blocks on the tracks of a moving storage medium of the device, each block comprising a plurality of codewords and a plurality of block-level check bytes derived from the codewords, each codeword including data bytes and codeword check bytes mapped from a plurality of equal-length data byte strings according to a linear error correction code, wherein said apparatus comprises:

(a) means (FIG. 2/102, 107, 113; FIG. 3/102, 107, 113) for generating and recording each block responsive to the plurality of data byte strings and further includes:

(a1) means (FIG. 2/101; FIG. 3A/209, 239) for logically summing the data byte strings and means (FIG. 2/103, 109, 113; FIG. 3A/221, 219, 217) for mapping the logical sum and the data byte strings into counterpart codewords including codeword and block-level check bytes in accordance with the same linear error correction code;

(a2) means (FIG. 2/105; FIG. 3A/211, S4–S8, 221, 235, 233, 207) for logically summing the codewords and means for concatenating the codewords including codeword check bytes and the logical sum including the block-level check bytes in a predetermined interleave pattern (FIG. 3B); and (b) means for accessing each block from the storage medium on an opportunistic or scheduled basis and for processing the accessed block to detect and correct incipient bytes in error and further including:

(b1) means (FIG. 5/407, 409, 411, 413, 443) for deriving syndromes from purported codewords and their logical sum and means (429, 425) for identifying any nonzero syndromes; and (b2) means (429, 431–437, 439, 441) for processing any identified codeword nonzero syndromes to correct any bytes in error within the correction capability of the codeword and means (413, 443, 439, 445, 447, 423, 425, 453) for processing any block-level nonzero syndromes either to locate and correct bytes in error in any single codeword exceeding the correction capability of the codeword but within the correction capability of the block, or to indicate that the bytes in error exceed the correction capability of both the codeword and block levels (457, 459).

12. The apparatus according to claim 11, wherein means (b2) further includes:

(b2a) means for generating first error location and value indicia (e,l) as a function of any identified purported codeword nonzero syndromes within the correction capability of the codeword;

(b2b) means for generating second error location and value indicia as a function of the purported block check bytes nonzero syndromes and the first bytes in error and value indicia for those bytes in error exceeding the correction capability of the codeword but within the correction capability of the block check bytes.

13. An article of manufacture comprising a machine-readable memory having stored therein indicia of a plurality of processor-executable control program steps for detecting and correcting multibyte errors in long byte strings recorded on a moving storage medium of a storage device in blocks, each block comprising a plurality of codewords and a plurality of block-level check bytes derived from the codewords, each codeword including data bytes and codeword check bytes mapped from a plurality of equal-length data byte strings according to a linear error correction code, said device including a processor arrangement for executing linear error correction encoding and for detecting and correcting errors in codewords accessed from said storage medium, said indicia of the plurality of control program steps executable at the device processor arrangement include:

(a) first indicia of a control program step for generating and recording each block responsive to the plurality of data byte strings, said first indicia further including indicia of a control program step comprising the substeps of:

(a1) logically summing the data byte strings and mapping the logical sum and the data byte strings into counterpart codewords including codeword check bytes and a coded logical sum including block-level check bytes in accordance with the same linear error correction code;

(a2) logically summing the codewords including the coded logical sum and interleaving the codewords including codeword check bytes, the logical sum, and the block-level check bytes in a predetermined interleave pattern; and (b) second indicia of a control program step for accessing each block from the storage medium on an opportunistic or scheduled basis and processing the accessed block to detect and correct incipient bytes in error, said second indicia further including indicia of a control program step comprising the substeps of:

(b1) deriving syndromes from the check bytes therein and identifying any nonzero syndromes; and (b2) processing any identified nonzero syndromes over the codewords to correct any bytes in error using the codeword check bytes, and processing any block-level nonzero syndromes either to locate and correct bytes in error in any single codeword exceeding the correction capability of the codeword but within the capability of the block, or to indicate that the bytes in error exceed the correction capability of both the codeword and block levels.

* * * * *